United States Patent
Nomura et al.

(10) Patent No.: US 10,984,989 B2
(45) Date of Patent: Apr. 20, 2021

(54) CHARGE NEUTRALIZER AND PLASMA GENERATOR

(71) Applicants: KASUGA DENKI, INC., Kanagawa (JP); Japan Aerospace Exploration Agency, Tokyo (JP)

(72) Inventors: Nobuo Nomura, Kawasaki (JP); Tomofumi Mogami, Kawasaki (JP); Kazuki Minemura, Kawasaki (JP); Daiki Koda, Tokyo (JP); Takato Morishita, Tokyo (JP); Satoshi Hosoda, Tokyo (JP); Hitoshi Kuninaka, Tokyo (JP)

(73) Assignees: KASUGA DENKI, INC.; JAPAN AEROSPACE EXPLORATION AGENCY

( * ) Notice: Subject to any disclaimer, the term of this patent is extended or adjusted under 35 U.S.C. 154(b) by 0 days.

(21) Appl. No.: 16/495,123

(22) PCT Filed: Nov. 28, 2018

(86) PCT No.: PCT/JP2018/043779
§ 371 (c)(1),
(2) Date: Sep. 18, 2019

(87) PCT Pub. No.: WO2020/054085
PCT Pub. Date: Mar. 19, 2020

(65) Prior Publication Data
US 2020/0279722 A1    Sep. 3, 2020

(30) Foreign Application Priority Data

Sep. 12, 2018  (JP) .............................. JP2018-170898

(51) Int. Cl.
*H01J 37/32*   (2006.01)
*H05H 1/46*    (2006.01)

(52) U.S. Cl.
CPC .... *H01J 37/32678* (2013.01); *H01J 37/3222* (2013.01); *H05H 1/46* (2013.01); *H01J 2237/0044* (2013.01); *H01J 2237/182* (2013.01)

(58) Field of Classification Search
None
See application file for complete search history.

(56) References Cited

U.S. PATENT DOCUMENTS 5,280,219 A * 1/1994 Ghanbari .......... H01J 37/32192
                                                   204/298.16
5,792,522 A * 8/1998 Jin ........................ C23C 14/046
                                                    257/E21.585

(Continued)

FOREIGN PATENT DOCUMENTS

CN    1055275 A    10/1991
CN    2208742 Y     9/1995

(Continued)

OTHER PUBLICATIONS

International Search Report dated Feb. 19, 2019 in corresponding PCT International Application No. PCT/JP2018/043779.

(Continued)

*Primary Examiner* — Amy Cohen Johnson
*Assistant Examiner* — James H Cho
(74) *Attorney, Agent, or Firm* — Ostrolenk Faber LLP

(57) ABSTRACT

A charge neutralizer that includes a vacuum chamber which is capable of having a charged object installed therein and includes a high vacuum processing unit that performs vapor deposition, and a plasma generator configured to supply plasma caused by an electron cyclotron resonance to an inside of the vacuum chamber. The plasma generator (Continued)

includes a plasma source configured to generate the plasma, and a flange configured to install the plasma source inside the vacuum chamber.

8 Claims, 10 Drawing Sheets

(56) References Cited

U.S. PATENT DOCUMENTS

| | | | |
|---|---|---|---|
| 6,010,755 | A | 1/2000 | Suzuki |
| 9,357,624 | B1 | 5/2016 | Gefter |
| 2005/0160986 | A1* | 7/2005 | Hur .................. H01J 37/32678 118/723 MW |
| 2006/0042916 | A1 | 3/2006 | Fleury |
| 2014/0001983 | A1 | 1/2014 | Pacquet |
| 2016/0042916 | A1 | 2/2016 | Wang |

FOREIGN PATENT DOCUMENTS

| | | | |
|---|---|---|---|
| CN | 1343000 | A | 4/2002 |
| CN | 1800441 | A | 7/2006 |
| CN | 101031178 | A | 9/2007 |
| CN | 103695839 | A | 4/2014 |
| EP | 0407169 | A2 | 1/1991 |
| JP | 07-258855 | A | 10/1995 |
| JP | H07-258855 | * | 10/1995 |
| JP | 10-298758 | A | 11/1998 |
| JP | A-11-279764 | | 10/1999 |
| JP | H11-279764 | * | 10/1999 |
| JP | 2002-088479 | A | 3/2002 |
| JP | 2002-110396 | A | 4/2002 |
| JP | 2009-181938 | A | 8/2009 |
| JP | 2011-022531 | A | 2/2011 |
| TW | 201606111 | A | 2/2016 |
| TW | 201625074 | A | 7/2016 |

OTHER PUBLICATIONS

Written Opinion dated Feb. 19, 2019 in corresponding PCT International Application No. PCT/JP2018/043779.
Chinese Office Action, dated Mar. 16, 2020, issued in corresponding Chinese Patent Application No. 201880024348.0. English Translation. Total 15 pages.
Office Action dated Feb. 24, 2020 issued in corresponding Korean Patent Application No. 10-2019-7029846 with English translation.
Korean Notice of Decision to Grant Patent, dated Aug. 21, 2020, issued in corresponding Korean Patent Application No. 10-2019-7029846. English translation. 4 pages.
Taiwan Office Action, dated Feb. 5, 2021, issued in corresponding Taiwanese Patent Application No. 107142746. English translation of Search Report. Total 5 pages.

* cited by examiner

CHARGE NEUTRALIZER AND PLASMA GENERATOR

CROSS-REFERENCE TO RELATED APPLICATIONS

The present application is a 35 U.S.C. §§ 371 national phase conversion of PCT/JP2018/043779, filed Nov. 28, 2018, which claims priority to Japanese Patent Application No. 2018-170898, filed Sep. 12, 2018, the contents of which are incorporated herein by reference.

TECHNICAL FIELD

The present invention relates to a charge neutralizer and a plasma generator.

BACKGROUND ART

Conventionally, there is a charge neutralizer which is a charge neutralizer having a vacuum chamber, and performs processing such as vacuum vapor deposition and charge removal on a charged object in the vacuum chamber. An inside of such a charge neutralizer needs to have two spaces including a high vacuum region that is a space for processing such as vacuum vapor deposition and is a space with a high degree of vacuum, and a low vacuum region that is a space for charge removal and is a space with a low degree of vacuum. Such a charge neutralizer removes the charge of a charged object by spouting gas toward the charged object that is an object of charge removal in an evacuated vacuum chamber (refer to Patent Document 1). More specifically, such a charge neutralizer removes the charge of a charged object by passively discharging a charged object. Such a charge neutralizer, for example, causes a gas such as argon to flow to a low vacuum region for performing charge removal via a gas introduction pipe, generates a plasma using a DC power supply, and brings an object of charge removal and the plasma in contact with each other to remove the charge of a charged object (refer to Patent Document 2).

CITATION LIST

Patent Literature

[Patent Document 1]
Japanese Unexamined Patent Application, First Publication No. 2009-181938
[Patent Document 2]
Japanese Unexamined Patent Application, First Publication No. H10-298758

SUMMARY OF INVENTION

Technical Problem

However, since such a charge neutralizer needs to include a high vacuum region and a low vacuum region, there is a problem that the device is enlarged in size.

The present invention has been made in view of the problems described above, and an object thereof is to provide a charge neutralizer which does not have to include a high vacuum region and a low vacuum region.

Solution to Problem

According to one aspect of the present invention, a charge neutralizer includes a vacuum chamber which is capable of having a charged object installed therein and includes a high vacuum processing unit, and a plasma generator configured to supply plasma caused by an electron cyclotron resonance to an inside of the vacuum chamber. The plasma generator includes a plasma source configured to generate the plasma, and a flange with which the plasma source is installed inside the vacuum chamber.

Advantageous Effects of Invention

According to the present invention, it is possible to provide a charge neutralizer which does not have to include a high vacuum region and a low vacuum region.

DESCRIPTION OF EMBODIMENTS

Figure 1:
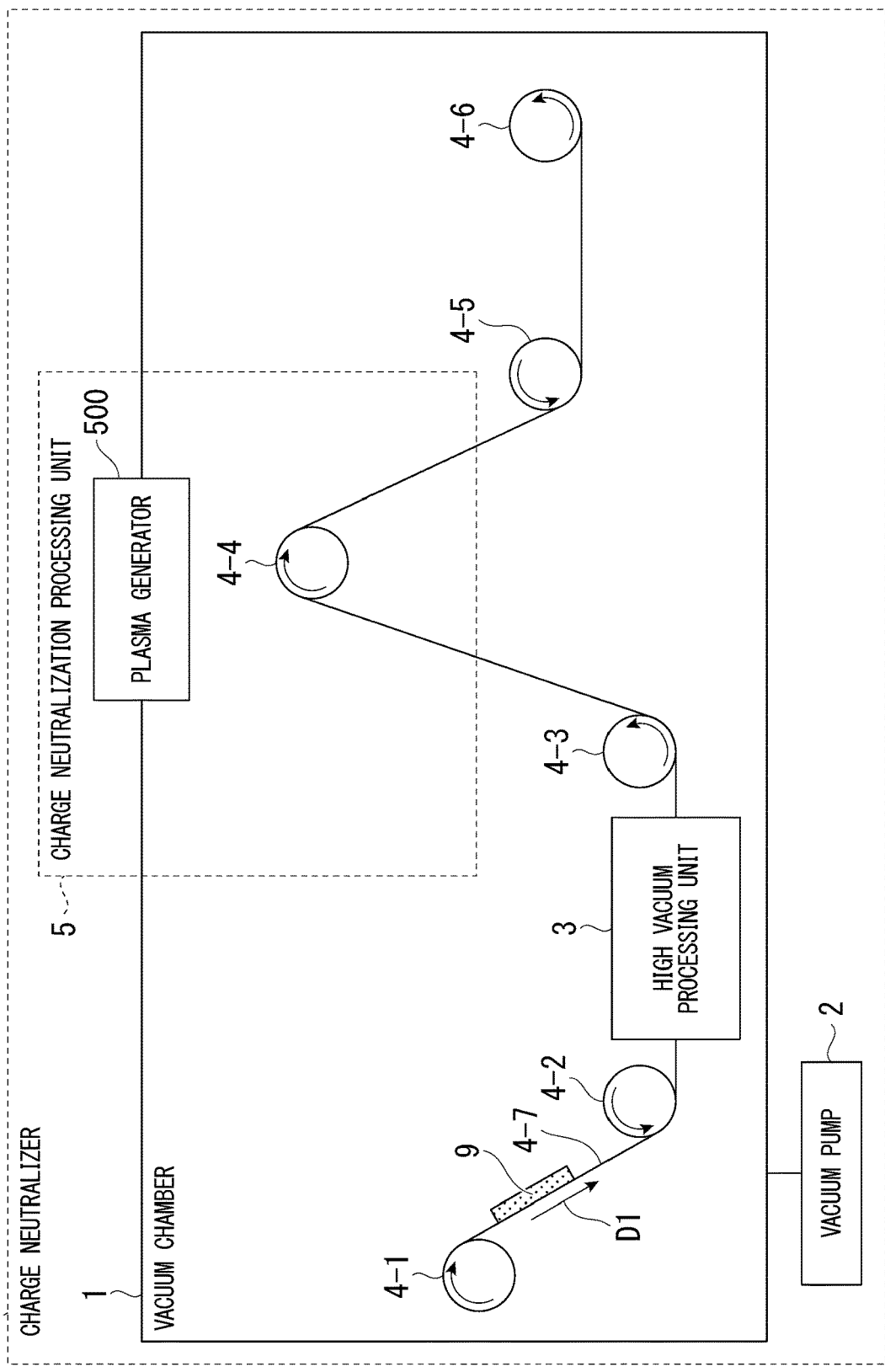
FIG. 1 is a diagram which shows an example of a configuration of a charge neutralizer 100 according to an embodiment.

FIG. 1 is a diagram which shows an example of a configuration of a charge neutralizer 100 according to an embodiment.

The charge neutralizer 100 removes charge of a charged object 9. Furthermore, the charge neutralizer 100 executes processing that requires a high vacuum such as vapor deposition for the charged object 9. Hereinafter, the processing that requires a high vacuum is referred to as high vacuum processing for simplicity of description. The charged object 9 may be any chargeable object, and may be, for example, a film sheet subjected to vapor deposition processing. The charge neutralizer 100 removes, for example, charge of a film sheet to limit a decrease in processing accuracy due to charging of the film sheet, which is a decrease in processing accuracy in processing of the film sheet. The charging of a film sheet is caused by a movement, friction, or the like of a polymer material constituting the film sheet. The charge neutralizer 100 performs, for example, charge removal in a process in which charge removal is required in a transporting process of an insulator such as a polymer material. The charge neutralizer 100 performs, for example, charge removal in a process in which charge removal is required among pieces of processing executed by a high vacuum processing unit 3 to be described below.

The charge neutralizer 100 includes, for example, a vacuum chamber 1, a vacuum pump 2, a high vacuum processing unit 3, a sending-out unit 4-1, guide units 4-2 to 4-5, a winding unit 4-6, a conveyor 4-7, and a charge neutralization processing unit 5.

The vacuum chamber 1 is a housing which is hollow inside. The vacuum chamber 1 is not deformed if a difference between an external pressure and an internal pressure is less than a predetermined pressure. The vacuum chamber 1 can have a charged object 9 installed inside.

The vacuum pump 2 draws air into the vacuum chamber 1 and sets a pressure in the vacuum chamber 1 to a predetermined pressure. The predetermined pressure is, for example, $10^{-5}$ Pa or more and 1 Pa or less.

The high vacuum processing unit 3 executes high vacuum processing on the charged object 9. The high vacuum processing is processing to be executed at a high vacuum. The high vacuum is a vacuum of $10^{-5}$ Pa or more and 1 Pa or less. The high vacuum processing unit 3 may be any device which executes high vacuum processing, and may be, for example, a vapor deposition unit.

The high vacuum processing unit 3 executes, for example, a transport process of insulating materials such as polymer materials in a vacuum chamber with a high vacuum maintained, a vapor deposition process of metals such as aluminum, nickel, titanium, or chromium, a vapor deposition process of ceramics such as SiO, $SiO_2$, $Al_2O_3$, $CaF_2$, or $SnO_2$, a micro-fabrication process or a thin film formation process of semiconductor materials such as wafers in very large scale integration (VLSI) manufacturing, a thin film generation process of organic materials in an organic electro-luminescence (EL) production process, a vapor deposition process of aluminum used as a cathode, and the like.

The charged object 9 is transported by the sending-out unit 4-1, the guide units 4-2 to 4-5, the winding unit 4-6, and the conveyor 4-7. More specifically, the charged object 9 is sent out by the sending-out unit 4-1, and is transported to the winding unit 4-6 via the guide units 4-2 to 4-5 by the conveyor 4-7.

The charge neutralization processing unit 5 removes charge of the charged object 9 and includes a plasma generator 500. The plasma generator 500 generates a plasma and is connected to a vacuum chamber 1 by a flange.

The plasma generated by the plasma generator 500 fills the inside of the vacuum chamber 1.

Figure 2:
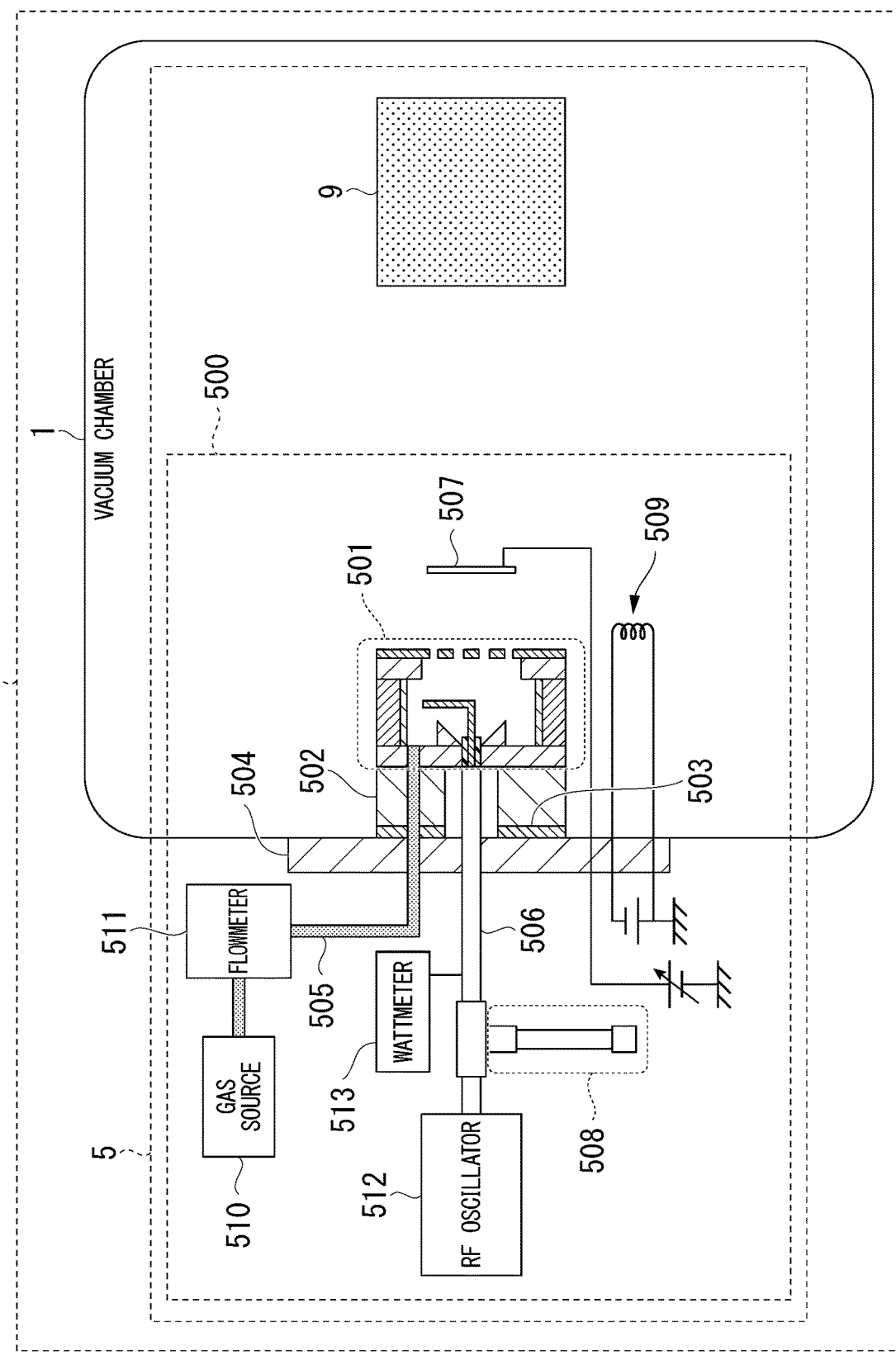
FIG. 2 is a diagram which shows an example of a configuration of a plasma generator 500 according to the embodiment.

FIG. 2 is a diagram which shows an example of a configuration of the plasma generator 500 according to the embodiment.

The plasma generator 500 includes, for example, a plasma source 501, a connector 502, a heat conductor 503, a flange 504, a gas port 505, a microwave feedthrough 506, an electron collector 507, a microwave tuner 508, a filament 509, a gas source 510, a flowmeter 511, an RF oscillator 512, and a wattmeter 513.

The plasma source 501 generates a plasma using an electron cyclotron resonance. The plasma source 501 is electrodeless because it generates a plasma using an electron cyclotron resonance. A detailed configuration of the plasma source 501 will be described below.

The connector 502 connects the flange 504 to the plasma source 501, and transfers heat generated in the plasma source 501 to the flange 504 via the heat conductor 503. The connector 502 limits the plasma source 501 from reaching a predetermined temperature or higher. The connector 502 may be any portion as long as it has thermal conductivity enough to limit the plasma source 501 from reaching a predetermined temperature or higher. The connector 502 may be, for example, an aluminum block, may be a copper block, or may also be a carbon block.

The heat conductor 503 transfers the heat transferred by the connector 502 to the flange 504. The heat conductor 503 limits the plasma source 501 from reaching a predetermined temperature or higher. The heat conductor 503 has thermal conductivity which is sufficient to limit the plasma source 501 from reaching a predetermined temperature or higher, and may be any unit as long as it has thermal conductivity higher than that of the connector 502. The heat conductor 503 may be, for example, a mesh of copper or may be a carbon sheet.

The flange 504 connects the plasma source 501 to the vacuum chamber 1, whereby the plasma source 501 is installed inside the vacuum chamber 1. The flange 504 is connected to the connector 502, and radiates the heat transferred via the connector 502 and the heat conductor 503 outside of the vacuum chamber 1. The flange may be any flange and may be, for example, a flange based on an ICF standard.

The gas port 505 supplies gas to the plasma source 501. For example, the gas port 505 may supply gas to a space 21 to be described below. The gas supplied by the gas port 505 may be any gas as long as it promotes generation of plasma. The gas supplied by the gas port 505 may be, for example, an inert gas such as xenon, argon, or nitrogen, and may be an active gas such as air or oxygen. Hereinafter, the gas supplied by the gas port 505 is referred to as a discharge gas.

The microwave feedthrough 506 transmits microwaves from the outside of the vacuum chamber 1 to the plasma source 501. The microwave feedthrough 506 may be any type as long as it can transmit microwaves from outside of the vacuum chamber 1 to the plasma source 501. The microwave feedthrough 506 may be, for example, a micro coaxial cable connected to an SMA terminal. Note that a frequency of the microwaves transmitted by the microwave feedthrough 506 may be any frequency as long as it satisfies an electron cyclotron resonance condition, and may be, for example, 4.25 GHz.

The electron collector 507 attracts the plasma generated by the plasma source 501. For example, the electron collector 507 may be brought to a predetermined potential by a predetermined voltage being applied thereto, and attracts a plasma according to a potential difference from the plasma source 501. The electron collector 507 may have any shape as long as it does not confine the plasma, and may be, for example, a circle with a diameter of 2 cm.

The microwave tuner 508 limits degradation in transmission efficiency of microwaves to the plasma source 501. For example, the microwave tuner 508 limits the degradation in transmission efficiency by reflecting microwaves which are not absorbed by the plasma source 501 and are reflected toward the plasma source 501. This means that the microwave tuner 508 matches impedances between the microwave feedthrough 506 and plasma generated in the plasma source 501.

The filament 509 ignites gas supplied to the inside of the plasma source 501. The filament 509 is a filament for plasma ignition, and can ignite gas with a low flow rate and a gas with a high ionization energy. Note that the plasma generator 500 may not necessarily include the filament 509.

The gas source 510 supplies the discharge gas to the gas port 505. The gas source 510 may be anything which can supply discharge gas to the gas port 505, and may be, for example, a container containing discharge gas.

The flowmeter 511 measures a flow rate of gas flowing through the gas port 505.

The RF oscillator 512 generates microwaves. The microwaves generated by the RF oscillator 512 are transmitted to the plasma source 501 via the microwave feedthrough 506.

The wattmeter 513 measures power of microwaves passing through the microwave feedthrough 506 and reflected by the plasma source 501. A user can read a measurement value of the wattmeter 513 and determine whether plasma has ignited according to the read measurement value.

In this manner, since the plasma generator 500 includes the flange 504, the user can provide the plasma source 501 at any place in the vacuum chamber 1.

<Details of Plasma Source 501>

Here, with reference to FIGS. 3 and 4, details of the plasma source 501 will be described. Hereinafter, orthogonal coordinates having an X-axis, a Y-axis, and a Z axis are introduced to simplify a description.

The plasma source 501 generates plasma in a high vacuum. More specifically, the plasma source 501 generates plasma at a degree of vacuum substantially the same as a degree of vacuum of the high vacuum processing unit 3. Hereinafter, the details of the plasma source 501 will be described.

Figure 3:
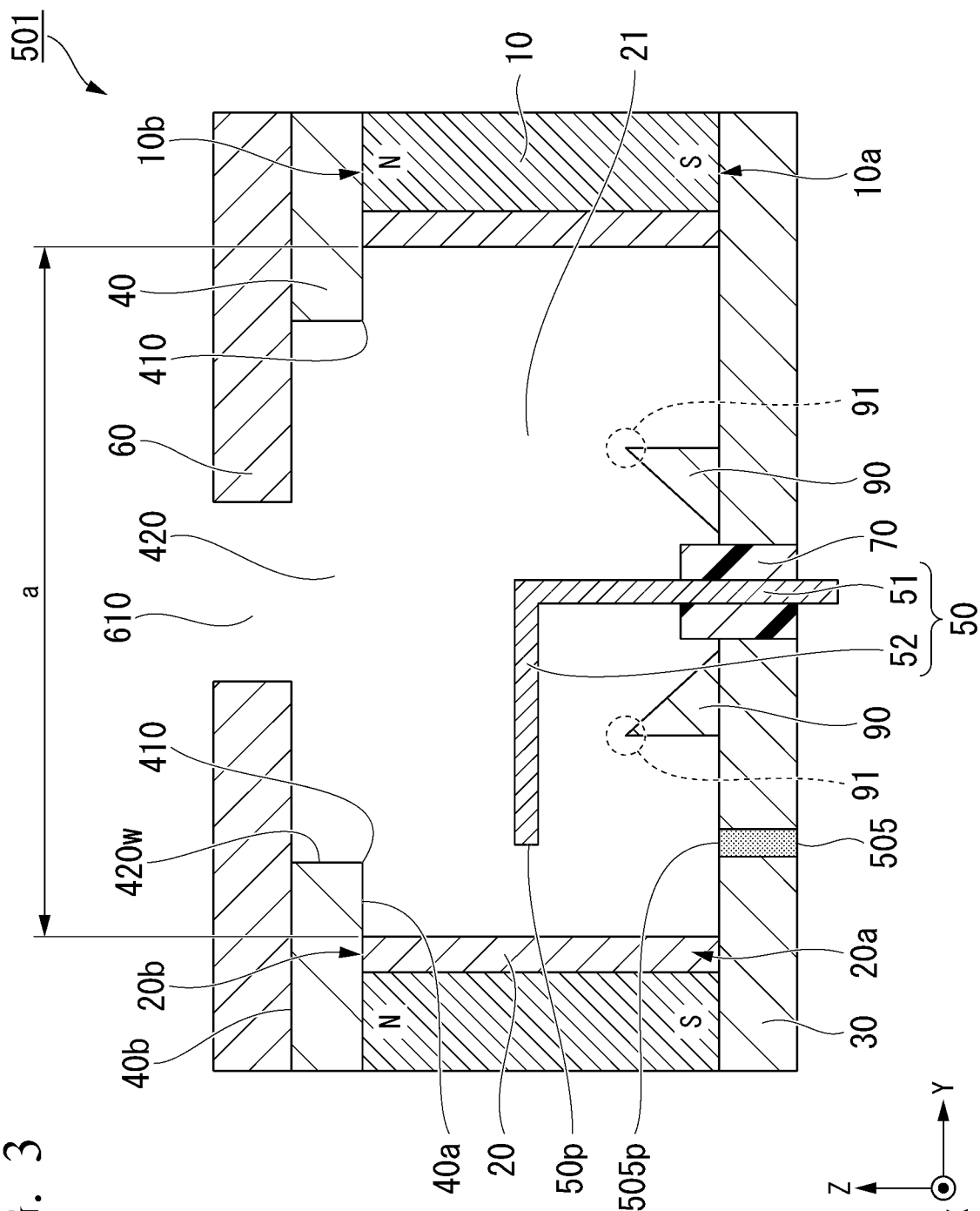
FIG. 3 is a schematic cross-sectional view of a plasma source 501 in the embodiment.

FIG. 3 is a schematic cross-sectional view of the plasma source 501 in the embodiment.

Figure 4:
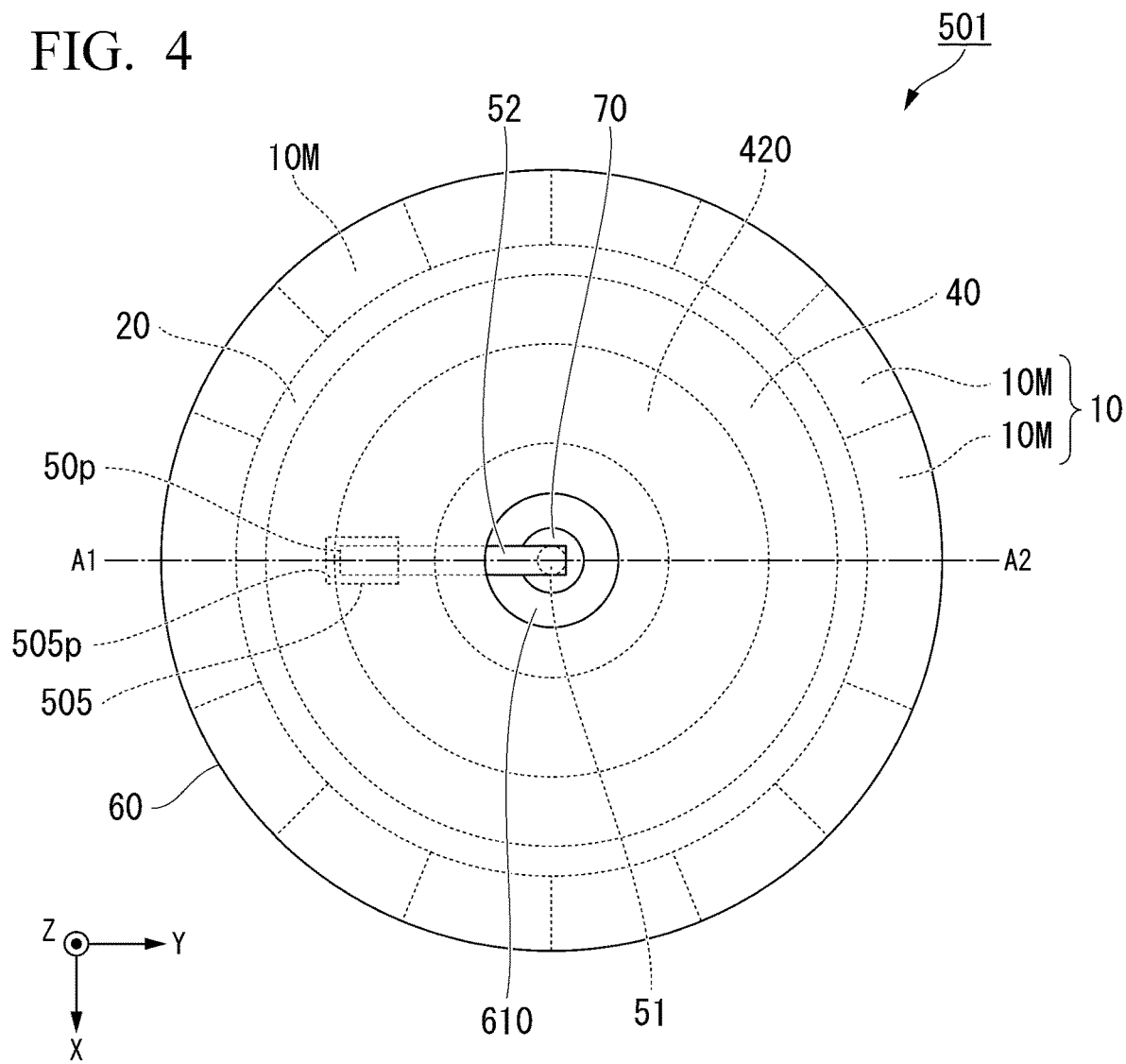
FIG. 4 is a schematic top view of the plasma source 501 in the embodiment.

FIG. 4 is a schematic top view of the plasma source 501 in the embodiment. In FIG. 3, a cross-section at a position of line A1-A2 of FIG. 4 is shown.

The plasma source 501 includes a cylindrical magnet 10, a cylindrical body 20, a first magnetic circuit unit 30, a second magnetic circuit unit 40, an antenna 50, a nozzle portion 60, a gas port 505, and an insulator 70.

The cylindrical magnet 10 is a cylindrical magnetic body and is hollow therein. The cylindrical magnet 10 has an opening end 10a (a first opening end) and an opening end 10b (a second opening end) positioned on an opposite side of the opening end 10a. In the cylindrical magnet 10, for example, the opening end 10a has an S polarity (a first polarity) and the opening end 10b has an N polarity (a second polarity) opposite to the S polarity.

As shown in FIG. 4, for example, a plurality of block-shaped magnets 10M made of samarium cobalt are arranged annularly in the XY axis plane in the cylindrical magnet 10. A polarity of the cylindrical magnet 10 is not limited to the example described above, the opening end 10a may indicate an N polarity, and the opening end 10b may indicate an S polarity.

An outer shape of the cylindrical magnet 10 is, for example, a circular shape. When an outer diameter of the cylindrical magnet 10 is, for example, 50 mm or less, reduction in size of the plasma source 501 is able to be realized. The outer shape of the cylindrical magnet 10 is not limited to a circular shape, and may be a polygonal shape such as a triangle, a square, a pentagon, a hexagon, or the like.

The cylindrical body 20 is surrounded by the cylindrical magnet 10. An inside of the cylindrical body 20 is hollow. The cylindrical body 20 has an opening end 20a and an opening end 20b positioned on an opposite side of the opening end 20a. The opening end 20a is configured to be flush with the opening end 10a. The opening end 20b is configured to be flush with the opening end 10b. The cylindrical body 20 and the cylindrical magnet 10 are concentrically positioned in the X-Y axis plane. The cylindrical body 20 and the cylindrical magnet 10 do not have to be concentrically positioned, and respective central axes may slightly deviate from each other.

The outer shape of the cylindrical body 20 is appropriately changed in accordance with the outer shape of the cylindrical magnet 10. In the example of FIG. 4, the outer shape of the cylindrical body 20 is a circular shape. The cylindrical body 20 contains, for example, molybdenum (Mo).

The magnetic circuit unit 30 (the first magnetic circuit unit) is in contact with the opening end 10a of the cylindrical magnet 10 and the opening end 20a of the cylindrical body 20. The magnetic circuit unit 30 blocks the opening ends 10a and 20a. Here, "block" is not limited to the magnetic circuit unit 30 sealing the opening ends 10a and 20a without a gap, and also includes a case in which there is a minute gap or a case of sealing with a small diameter hole for allowing other members to penetrate therethrough provided in the magnetic circuit unit 30. The magnetic circuit unit 30 has a plate shape. The magnetic circuit unit 30 is a ferromagnetic body, and is made of, for example, soft iron. An outer shape of the magnetic circuit unit 30 is appropriately changed in accordance with the outer shape of the cylindrical magnet 10. In the example of FIG. 4, the outer shape of the magnetic circuit unit 30 is a circular shape.

The magnetic circuit unit 30 has a protrusion portion 90 provided in the space 21. The protrusion portion 90 protrudes from the magnetic circuit unit 30 to a corner portion 410 to be described below. The protrusion portion 90 is cylindrical, and surrounds a part of the antenna 50. A tip portion 91 of the protrusion portion 90 has a thickness which becomes thinner as it goes toward the corner portion 410 of the magnetic circuit unit 40 (the second magnetic circuit unit). An angle of the tip portion 91 is, for example, an acute angle. A mirror ratio of a magnetic field formed between the tip portion 91 and the corner portion 410 is 1.5 or more. A cross-section of the protrusion portion 90 viewed in a Z axis direction may be any shape as long as it is a shape of genus 1 in topology, and may also be, for example, an annular ring.

In addition, a strength of the magnetic field between the tip portion 91 and the corner portion 410 needs to be higher than a magnetic field satisfying an electron cyclotron resonance condition to mirror confine electrons heated by an electron cyclotron resonance. There is a relationship of $2\pi f = eB/m$ between a microwave frequency f and the electron cyclotron resonance condition. Here, e is an elementary electric charge, and m is an electron mass. When a microwave frequency is 2.45 GHz, the magnetic field satisfying the electron cyclotron resonance condition is 875 Gauss.

The magnetic circuit unit 40 is in contact with the opening end 10b of the cylindrical magnet 10 and the opening end 20b of the cylindrical body 20. The magnetic circuit unit 40 is disposed opposite to the magnetic circuit unit 30 with the cylindrical magnet 10 therebetween. The magnetic circuit unit 40 has a plate shape. The magnetic circuit unit 40 is a ferromagnetic body, and is made of, for example, soft iron. An outer shape of the magnetic circuit unit 40 is appropriately changed in accordance with the outer shape of the cylindrical magnet 10.

In the example of FIG. 4, an outer shape of the magnetic circuit unit 40 is circular.

The magnetic circuit unit 40 has an opening 420 (a first opening) which opens the space 21 surrounded by the cylindrical body 20. The opening 420 is disposed concentrically with respect to the magnetic circuit units 30 and 40. The opening 420 does not have to be disposed concentrically with respect to the magnetic circuit units 30 and 40, and respective central axes may slightly deviate from each other. An inner diameter of the opening 420 is larger than an outer diameter of the protrusion portion 90. The outer diameter of the protrusion portion 90 is a maximum value of an outer peripheral diagonal length passing through a center of the cross-section orthogonal to the Z axis. Note that the outer peripheral diagonal length is a diameter of a circle formed by an outer edge line of the protrusion portion 90 formed in an annular ring shape. In addition, in another viewpoint, the outer diameter of the protrusion portion 90 is inside a region surrounded by an inner peripheral line of the opening 420.

Here, the corner portion 410 will be described. The corner portion 410 is a position at which a principal surface 40a on the first magnetic circuit unit 30 side of the second magnetic circuit unit 40 intersects with an inner wall 420w of the first opening 420 in the second magnetic circuit unit 40. Hereinafter, an angle formed by the principal surface 40a and the inner wall 420w is referred to as an angle of the corner portion 410. The corner portion 410 at which the principal surface 40a on the magnetic circuit unit 30 side of the magnetic circuit unit 40 intersects with the inner wall 420w of the opening 420 in the magnetic circuit unit 40 is formed by providing the opening 420 in the magnetic circuit unit 40. The angle of the corner portion 410 is approximately 90° in the example of FIG. 3. The angle of the corner portion 410 may be an acute angle. For example, when the angle of the corner portion 410 is an acute angle, a cross-sectional shape of the opening 420 gradually tapers as the inner diameter becomes farther away from the magnetic circuit unit 30. Note that a principal surface positioned on an opposite side of the principal surface 40a of the magnetic circuit unit 40 is set as a principal surface 40b.

The antenna 50 is introduced from an outside of the plasma source 501 to the inside thereof. For example, the antenna 50 penetrates through the magnetic circuit unit 30 and is introduced to the space 21. The antenna 50 is a so-called microwave launcher. The antenna 50 contains, for example, molybdenum.

The antenna 50 is connected to the microwave feedthrough 506. The antenna 50 is connected to the RF oscillator 512 via the microwave feedthrough 506, and receives microwave power supplied by the RF oscillator 512. As a result, the antenna 50 emits microwaves to the space 21. A wavelength of the microwaves may be any wavelength as long as it satisfies the electron cyclotron resonance condition. The wavelength of microwaves may be, for example, 122 mm (2.45 GHz).

The antenna 50 has, for example, a rod shape, and is bent in the middle. For example, the antenna 50 has a first antenna unit 51, and a second antenna unit 52 connected to the first antenna unit 51.

The shape of the antenna 50 does not necessarily have to be in a rod shape, and does not have to be bent in the middle. The shape of the antenna 50 may be any shape as long as it is connected to the microwave feedthrough 506, and microwaves can be emitted to the space 21. The shape of the antenna 50 may be, for example, a linear shape.

The first antenna unit 51 is, for example, orthogonal to the magnetic circuit unit 30, and extends in a direction from the magnetic circuit unit 30 to a nozzle portion 60 to be described below. The first antenna unit 51 is positioned, for example, on a central axis of the magnetic circuit unit 30.

The second antenna unit 52 intersects with the first antenna unit 51. In the example of FIG. 3, the first antenna unit 51 and the second antenna unit 52 are orthogonal to each other, and the antenna 50 is in an L shape. The second antenna unit 52 is further positioned between the tip portion 91 and the corner portion 410. That is, the second antenna unit 52 is inserted into a magnetic field B1. Note that although details of the magnetic field B1 will be described below, the magnetic field B1 is a magnetic field formed in the space 21 by the magnetic circuit unit 30, the magnetic circuit unit 40, and the cylindrical magnet 10. In this manner, the antenna 50 is bent, and thereby microwaves are efficiently absorbed into the plasma. An angle formed by the first antenna unit 51 and the second antenna unit 52 is not limited to an orthogonal angle, and may be an obtuse angle or an acute angle.

The nozzle portion 60 is in contact with the magnetic circuit unit 40 on an opposite side of the magnetic circuit unit 30. For example, the nozzle portion 60 is in contact with a principal surface 40b of the magnetic circuit unit 40. The nozzle portion 60 has an opening 610 (a second opening). The opening 610 communicates with the opening 420. An opening area of the opening 610 is smaller than the opening area of the opening 420. The nozzle portion 60 may be any portion as long as it has an opening. The nozzle portion 60 may also be, for example, a punching metal.

The opening 610 is disposed concentrically with respect to the opening 420. The opening 610 does not have to be disposed concentrically with respect to the opening 420, and respective central axes may slightly deviate from each other. An inner diameter of the opening 610 is, for example, 5 mm. The space 21 communicates with an outside of the device via the opening 610, and thereby the plasma generated in the space 21 can be extracted from the opening 610. The nozzle portion 60 contains, for example, molybdenum. A thickness of the opening is, for example, 5 mm, 2.5 mm, or 1 mm.

The gas port 505 is introduced from an outside of the plasma source 501 to the space 21. The gas port 505 penetrates, for example, the magnetic circuit unit 30 and is introduced to the space 21. The gas port 505 penetrates, for example, the cylindrical magnet 10 and the cylindrical body 20, and is introduced to the space 21. The gas port 505 penetrates, for example, the magnetic circuit unit 40 and the nozzle portion 60, and is introduced to the space 21.

In the gas port 505, a supply port through which discharge gas is supplied is set as a supply port 505p and the supply port 505p is disposed such that a distance between the supply port 505p and a tip 50p of the antenna 50 becomes the shortest. For example, when the gas port 505 and the antenna 50 are viewed from above in the Z axis direction, the supply port 505p and the tip 50p oppose each other.

The insulator 70 is provided between the antenna 50 and the magnetic circuit unit 30. The insulator 70 includes fluorocarbon resin, quartz, and the like. As a result, insulation between the antenna 50 and the magnetic circuit unit 30 is maintained.

When an inner diameter of the cylindrical body 20 is set as a (mm), and a microwave cutoff wavelength of microwave power supplied to the space 21 is set as λ (mm) in the plasma source 501, the plasma source 501 is configured to satisfy a relational expression of $\lambda > 3.41 \times (a/2)$. When the cylindrical body 20 has a diameter which is that of a polygon, the inner diameter a is made the maximum inner diameter which is able to pass through a central axis of the cylindrical body 20.

Figure 5:
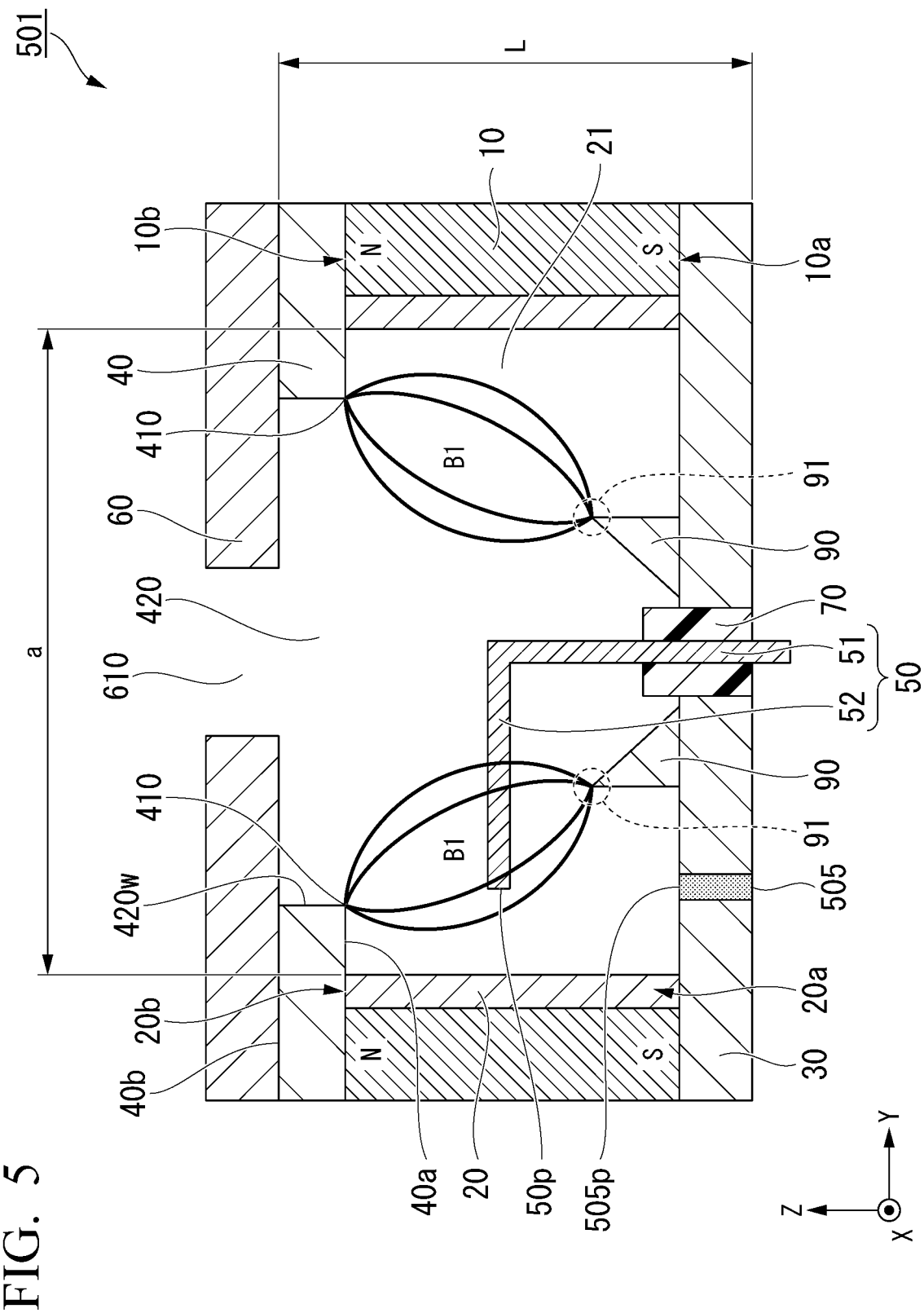
FIG. 5 is a schematic cross-sectional view which describes an operation of the plasma source 501 in the embodiment.

FIG. 5 is a schematic cross-sectional view which describes an operation of the plasma source 501 in the embodiment.

In the plasma source 501, each of the magnetic circuit unit 30 connected to the cylindrical magnet 10 and the magnetic circuit unit 40 connected to the cylindrical magnet 10 functions as a yoke material. Furthermore, the magnetic circuit unit 30 has the protrusion portion 90, and the magnetic circuit unit 40 has the corner portion 410. As a result, a magnetic field B1 (a mirror magnetic field) with a high mirror ratio is formed between both projections (between the protrusion portion 90 and the corner portion 410). Furthermore, the magnetic field B1 is formed in an annular ring shape because the protrusion portion 90 is cylindrical and the opening 420 of the magnetic circuit unit 40 is circular.

Under such circumstances, if discharge gas is supplied from the supply port 505p to the space 21 and microwaves are supplied from the antenna 50 to the space 21, the discharge gas discharges and an interaction between the microwaves and the magnetic field B1 causes an electron cyclotron resonance in the space 21. As a result, energy is selectively and directly supplied to electrons in plasma and electrons with high energy collide with the discharge gas to generate high density plasma in the space 21.

Here, the plasma source 501 is configured to satisfy the relational expression of $\lambda > 3.41 \times (a/2)$. As a result, in the space 21, microwaves are less likely to resonate, and a progress of microwaves in the space 21 is limited. As a result, microwaves are less likely to leak from the plasma source 501. In addition, if microwaves do not resonate, an electric field of microwaves does not increase, and a loss in microwaves on a container wall, which is proportional to the electric field of microwaves, can be limited.

Furthermore, a mirror magnetic field (the magnetic field B1) is formed between the protrusion portion 90 and the corner portion 410, and electrons confined in the magnetic field B1 are continuously heated by the electron cyclotron resonance in the plasma source 501. As a result, even if the electric field of microwaves is weak, it is possible to generate high energy electrons that can ionize discharge gas.

Moreover, in the plasma source 501, the inner diameter of the opening 420 is configured to be larger than the outer diameter of the protrusion portion 90. As a result, in the magnetic field B1, a magnetic force line becomes sparser as it goes from the protrusion portion 90 to the corner portion 410. As a result, a density of a magnetic flux on the nozzle portion 60 side is smaller than the density of magnetic flux on the protrusion portion 90 side.

As a result, in the space 21, a low magnetic field region is formed in the vicinity of the opening 610 of the nozzle portion 60, and plasma is less likely to be captured by a magnetic field in the vicinity of the opening 610. For this reason, a mobility of the plasma in the vicinity of the opening 610 increases, and electrons or ions in the plasma are efficiently injected from the opening 610.

For example, when xenon gas of a flow rate of about 0.3 sccm is introduced from the supply port 505p to the space 21, and microwaves of 8 W are put into the antenna 50, an electron current of about 200 mA and an ion current of about 5 mA are obtained from the opening 610.

Note that ions in plasma remaining in the space 21 pass through the magnetic field B1, and reach an inner wall of the cylindrical body 20 or the principal surfaces of the magnetic circuit units 30 and 40. Ions that hit the cylindrical body 20 or the magnetic circuit units 30 and 40 lose charges thereof, return to neutral gas, and are reused as discharge gas.

For this reason, in the plasma source 501, it is possible to maintain plasma with the least gas flow rate.

On the other hand, on the protrusion portion 90 side, a magnetic force line becomes denser as it goes from the corner portion 410 to the protrusion portion 90. As a result, a high magnetic field region is formed in the vicinity of the insulator 70, and a density of plasma exposed to the insulator 70 is higher than a density of plasma generated in the opening 420 in plasma generated in the space 21.

As a result, even if foreign matter such as a contamination or a film is deposited on the insulator 70 during discharge, the foreign matter is immediately removed by a sputtering effect of plasma. If the foreign matter contains a metal and the foreign matter is deposited on the insulator 70, the antenna 50 and the magnetic circuit unit 30 are conducted, and thus sufficient microwaves cannot be supplied from the antenna 50 to the space 21.

On the other hand, in the plasma source 501, if plasma is generated in the space 21, a foreign matter on the insulator 70 is removed by self-cleaning That is, the plasma source 501 can operate for a long time with maintenance free.

In addition, since the supply port 505p and the tip 50p of the antenna 50 are configured to be closest to each other in the plasma source 501, discharge gas is supplied to the vicinity of the second antenna unit 52. Accordingly, the discharge gas introduced from the supply port 505p to the space 21 is efficiently ionized by microwaves emitted from the antenna 50. As a result, plasma with high density is generated in the space 21.

In addition, when a distance between the magnetic circuit unit 30 and the nozzle portion 60 is set as L (mm), the plasma source 501 may be configured to satisfy a relational expression of $\lambda > 3.41 \times (L/2)$. As a result, microwaves are less likely to leak from the opening 610 of the nozzle portion 60 more reliably.

In this manner, the plasma source 501 includes the cylindrical magnet 10, the cylindrical body 20, the first magnetic circuit unit 30, the second magnetic circuit unit 40, the antenna 50, the nozzle portion 60, the gas port 505, and the insulator 70.

The cylindrical magnet 10 has the first opening end 10a and the second opening end 10b positioned on an opposite side to the first opening end 10a, the first opening end 10a has a first polarity, and the second opening end 10b has a second polarity opposite to the first polarity.

The cylindrical body 20 is surrounded by the cylindrical magnet 10.

The first magnetic circuit unit 30 is in contact with the first opening end 10a and blocks the first opening end 10a.

The second magnetic circuit unit 40 is in contact with the second opening end 10b, is disposed to be opposite to the first magnetic circuit unit 30, and has a first opening 420 which opens the space 21 surrounded by the cylindrical body 20.

The antenna 50 penetrates the first magnetic circuit unit 30, is introduced to the space 21, and can supply microwave power to the space 21.

The nozzle portion 60 is in contact with the second magnetic circuit unit 40 on an opposite side of the first magnetic circuit unit 30, and has a second opening 610 whose opening area is smaller than that of the first opening 420, and which communicates with the first opening 420.

The gas port 505 can penetrate the cylindrical magnet 10 and the cylindrical body 20, and supply discharge gas to the space 21.

The insulator 70 is provided between the antenna 50 and the first magnetic circuit unit 30.

In addition, in the plasma source 501, when the inner diameter of the cylindrical body 20 is set to a (mm) and a microwave cutoff wavelength of microwave power supplied to the space 21 is set to $\lambda$ (mm), the relational expression of $\lambda > 3.41 \times (a/2)$ is satisfied.

In such plasma source 501, microwaves are less likely to leak from the plasma source 501, the plasma source 501 generates plasma with high density, and electrons or ions can be injected to the outside of the plasma source 501.

More specifically, since microwaves are less likely to leak from the plasma source 501, the plasma generator 500 can generate plasma at a low flow rate. For this reason, the plasma generator 500 can limit degradation in a degree of vacuum inside the vacuum chamber 1 as the plasma is generated. Note that a low flow rate means a flow rate at which plasma cam be maintained, such as 0.05 SCM to 50 SCM.

As described above, the nozzle portion 60 limits a leakage of microwaves and a leakage of discharge gas. A magnitude by which the nozzle portion 60 limits the leakages of microwaves and discharge gas depends on the thickness of the nozzle portion 60, and a magnitude or the number of the openings 610. Moreover, the amount of plasma emitted from the space 21 to the inside of the vacuum chamber 1 via the opening 610 also depends on the thickness of the nozzle portion 60 and the magnitude or the number of the openings 610.

Specifically, as the thickness of the nozzle portion 60 becomes thinner, microwaves, discharge gas, and plasma are likely to leak into the vacuum chamber 1. In addition, as the magnitude or the number of the openings 610 becomes larger, microwaves, discharge gas, and plasma are likely to leak into the vacuum chamber 1. As the leakages of microwaves and discharge gas become larger, efficiency in generation of plasma is lowered. The amount of plasma emission decreases, efficiency in charge removal is lowered.

In this manner, since the nozzle portion 60 controls the leakage of microwaves, the leakage of discharge gas, the amount of plasma emission, a designer of the charge neutralizer 100 needs to appropriately design the thickness of the nozzle portion 60 and the magnitude or the number of the openings 610 in accordance with a purpose.

Figure 6:
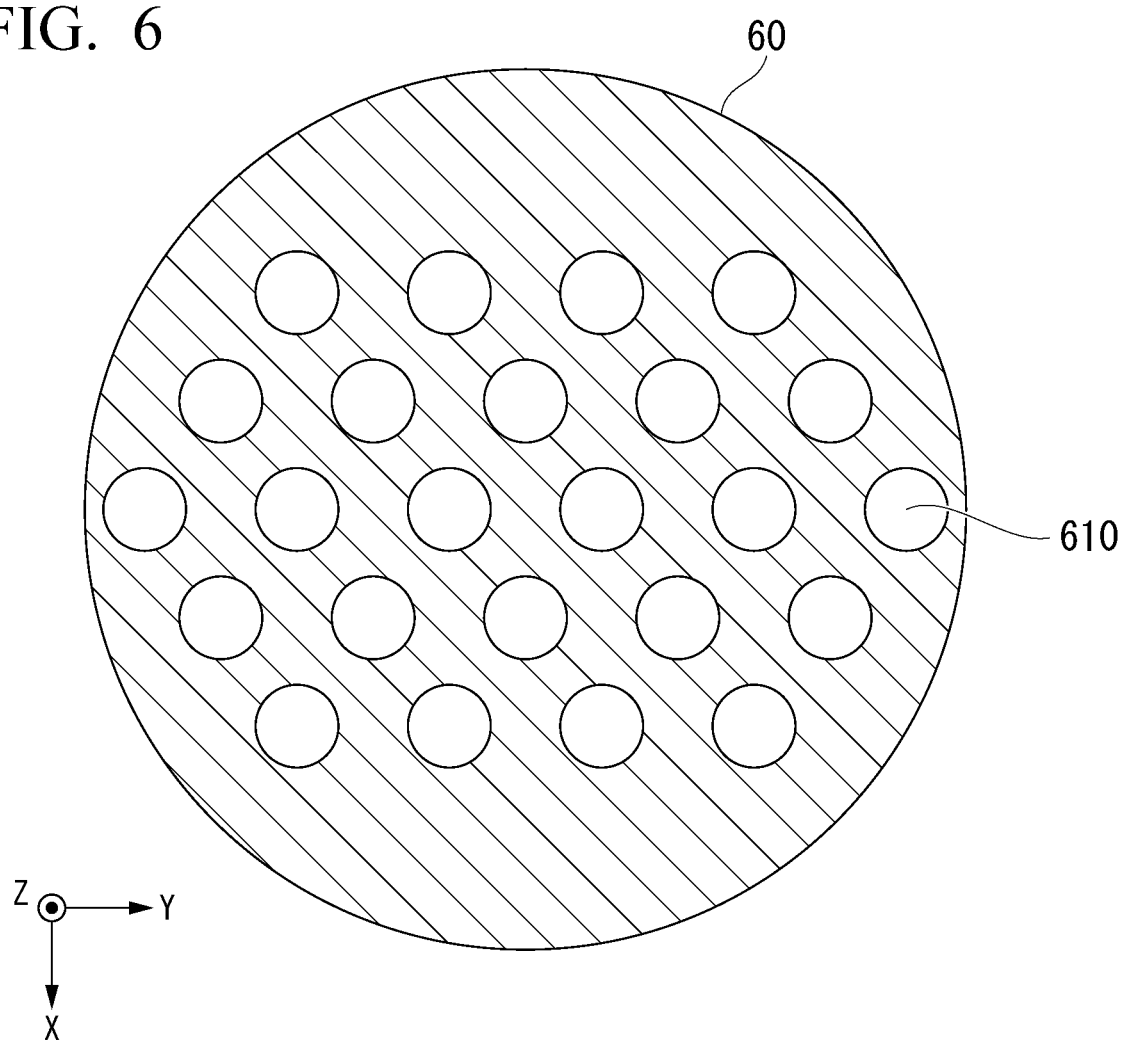
FIG. 6 is a view which shows an example of arrangement of openings 610 when a nozzle portion 60 in the embodiment has a plurality of openings 610.

FIG. 6 is a view which shows an example of arrangement of the openings 610 when a nozzle portion 60 in the embodiment has a plurality of openings 610.

In FIG. 6, the nozzle portion 60 includes the plurality of openings 610 which are circular and have the same diameter length in a lattice form.

Figure 7:
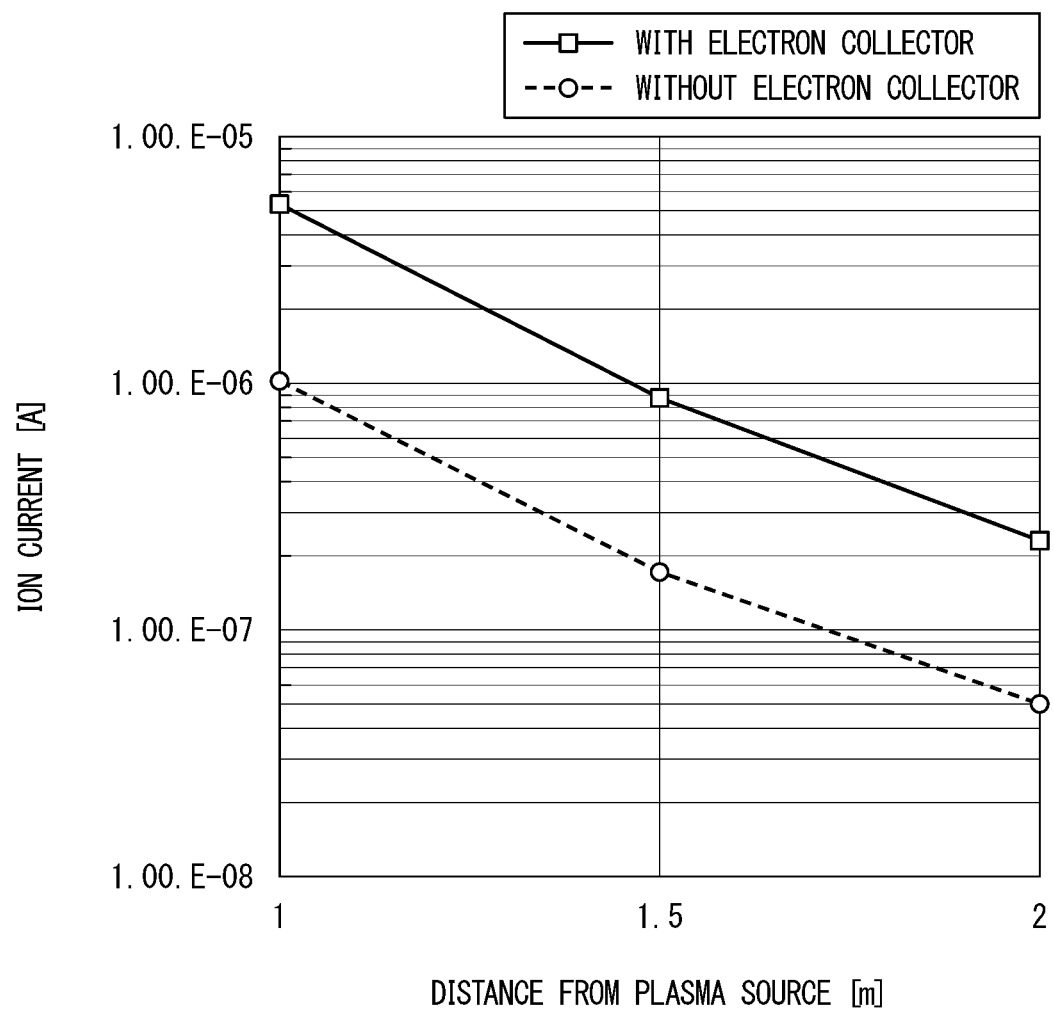
FIG. 7 is a view which shows experimental results indicating the effects of plasma being extracted from the plasma source 501 by an electron collector 507 in the embodiment.

FIG. 7 is a view which shows experimental results indicating an effect that plasma is extracted from the plasma source 501 by the electron collector 507 in the embodiment.

In FIG. 7, a horizontal axis represents a reach distance of an ion current generated from the plasma source 501. In FIG. 7, a vertical axis represents a current value of the ion current. FIG. 7 shows that the electron collector 507 increases the current value of the ion current. This shows that the electron collector 507 has an effect of extracting plasma.

SUMMARY

Since the charge neutralizer 100 configured in this manner includes the plasma generator 500 which has the plasma source 501 capable of generating plasma using discharge gas of a low flow rate, and the connector 502 transferring heat generated by the plasma source 501 to the outside of the device, it is possible to generate plasma while limiting a degradation in the degree of vacuum inside the vacuum chamber 1. For this reason, it is not necessary to have a high vacuum region and a low vacuum region, and enlargement of the device in size can be limited.

The charge neutralizer 100 configured in this manner includes the plasma generator 500 provided with the flange 504. For this reason, the charge neutralizer 100 configured in this manner can include the plasma generator 500 at an arbitrary place at which a flange is positioned on a housing of the vacuum chamber 1 by mounting the flange on the housing of the vacuum chamber 1.

In addition, since the charge neutralizer 100 configured in this manner includes the heat conductor 503, it can radiate heat generated in the plasma source 501 and limit occurrence of an unstable operation due to high heat.

Moreover, since the charge neutralizer 100 configured in this manner includes the plasma generator 500, it is not necessary to have a high vacuum region and a low vacuum region as described above. For this reason, the charge neutralizer 100 configured in this manner can reduce a load on the vacuum pump 2.

In addition, since the charge neutralizer 100 configured in this manner includes an electrodeless plasma generator 500, plasma is not necessarily generated by direct current discharge. For this reason, the charge neutralizer 100 configured in this manner can limit a degradation in efficiency of generating plasma due to consumption of electrodes for discharge, and deterioration of the charge neutralizer 100.

Moreover, the charge neutralizer 100 configured in this manner can generate plasma if a flow rate of discharge gas is within a range of 0.05 SCM to 50 SCM. In addition, the charge neutralizer 100 configured in this manner can generate plasma using a plurality of types of discharge gas.

For this reason, it is possible to remove charge of the charged object 9 using a flow rate and a type of discharge gas suitable for charge removal of the charged object 9. A term of "being suitable for charge removal of the charged object 9" means that invasion of the charged object 9 due to charge removal is lower than a predetermined level.

Modified Example

Note that the plasma generator 500 does not have to include only one opening 610 as the opening 610 for spouting plasma. The plasma generator 500 may include a plurality of openings 610 as an opening for spouting plasma. The plasma generator 500 having the plurality of openings 610 can emit plasma generated in the space 21 of the plasma source 501 into the charge neutralizer 100 more than a case of having one opening 610.

The plasma generator 500 may include, as an opening for spouting plasma, for example, a plurality of openings 610 positioned in a honeycomb shape, a plurality of openings 610 positioned in a grid shape, a plurality of openings 610 whose respective magnitude are not the same, or a plurality of openings 610 whose distance to a nearest opening is not constant.

Note that the electron collector 507 may have any shape as long as it can extract plasma.

The electron collector 507 may be, for example, a hollow shape in which a line connecting a center of the plasma source 501 and a center of the charged object 9 substantially passes through the center, may be, for example, cylindrical, or may also be an annular ring shape.

Note that the charge neutralizer 100 may include a blocking plate that blocks a contact between a place of a part of the charged object 9 and plasma.

Figure 8:
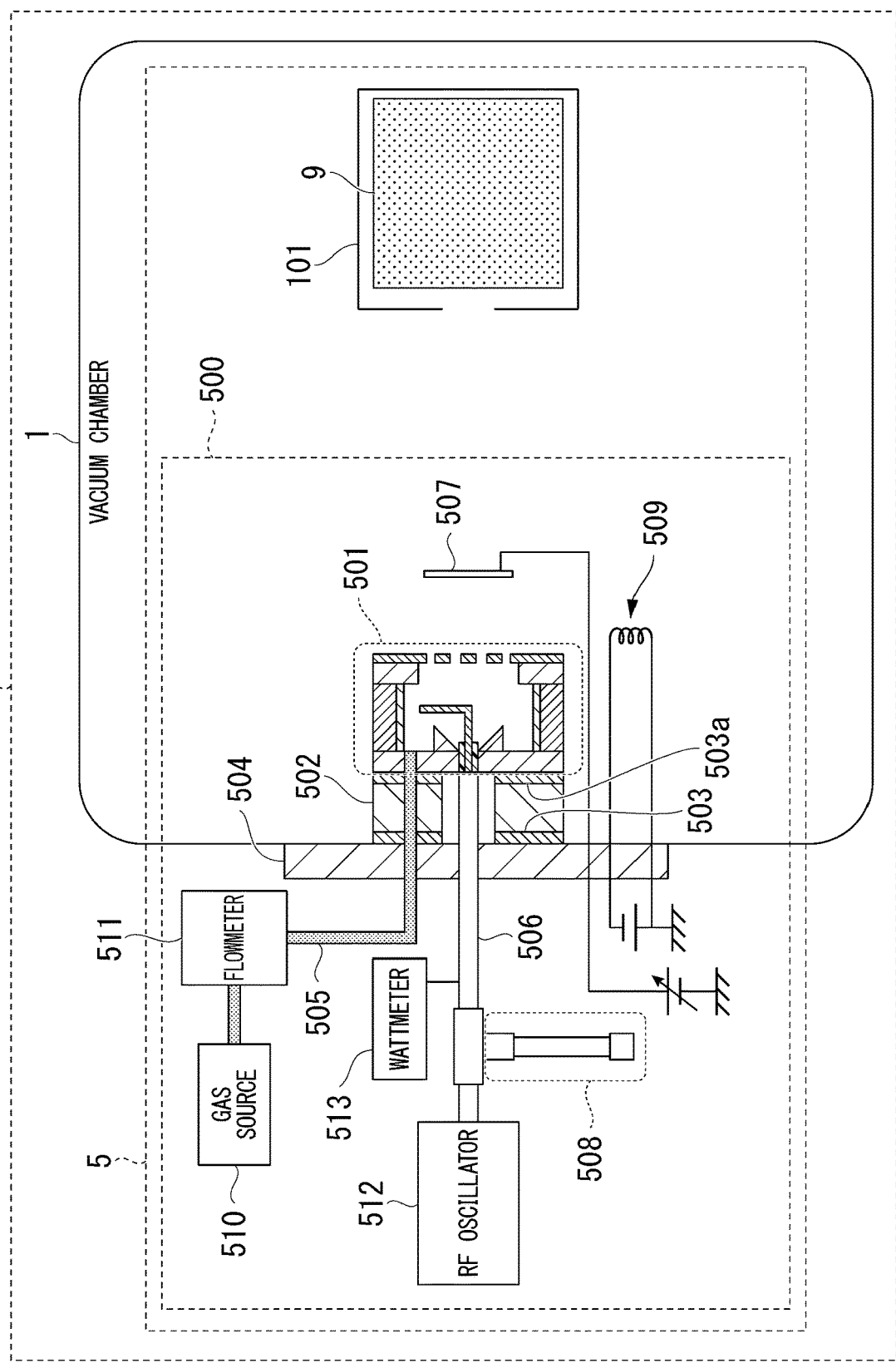
FIG. 8 is a view which shows an example of an inhibitor 101 in a modified example.

FIG. 8 is a view which shows an example of the inhibitor 101 in a modified example.

In FIG. 8, constituents having the same function as in FIG. 2 will be denoted by the same reference numerals to omit description thereof. In FIG. 8, the inhibitor 101 covers a part of the charged object 9, and inhibits a contact between plasma and the charged object 9. In this manner, a place at which a contact with plasma is inhibited by the inhibitor 101 remains charged, and is not subjected to charge removal. The inhibitor 101 may be, for example, a conductive member which blocks plasma at a place at which charge removal is not required. The inhibitor 101 may be, for example, a punching metal.

The charge neutralizer 100 of the modified example which is configured in this manner includes the inhibitor 101, it can remove charge of only a part of the charged object 9.

Figure 9:
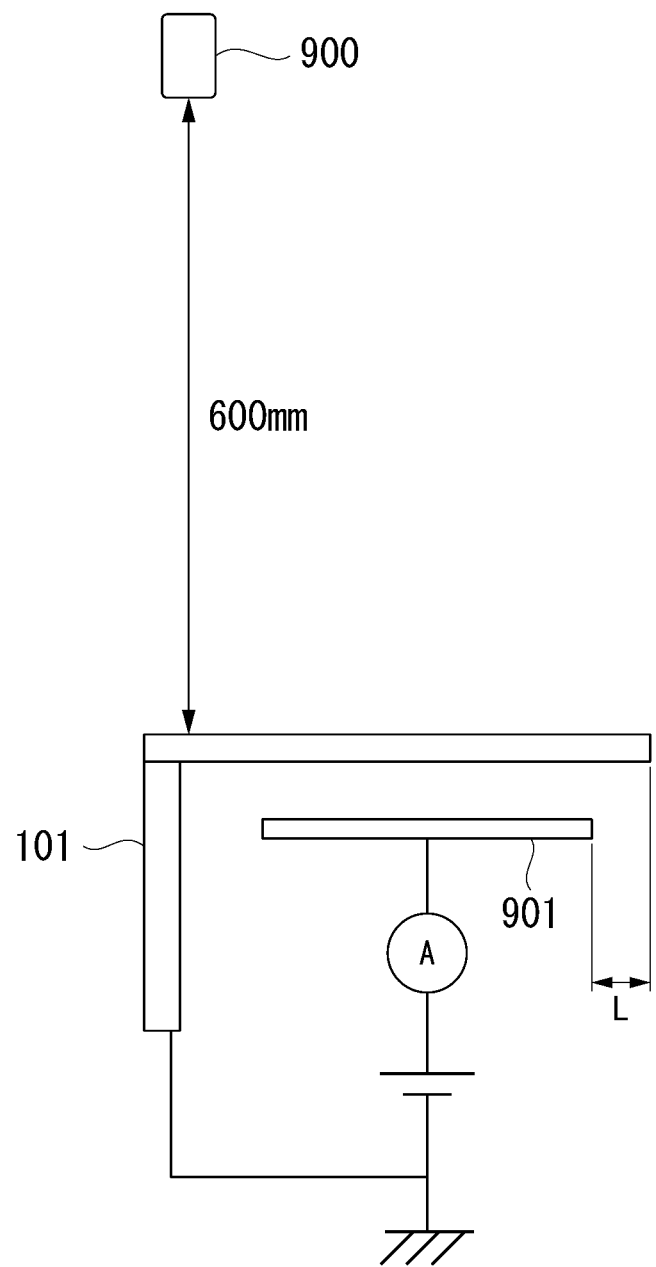
FIG. 9 is an explanatory diagram which describes an experimental environment of an experiment which shows an effect of the inhibitor 101 in the modified example.

FIG. 9 is an explanatory diagram which describes an experimental environment of an experiment which shows an effect of the inhibitor 101 in the modified example.

A neutralizer 900 emits plasma. The inhibitor 101 is positioned at a position 600 mm below the neutralizer 900. A charged electrode 901 is positioned at a position 20 mm below the inhibitor 101. The charged electrode 901 is an object of charge removal by the neutralizer 900. 100V is applied to the charged electrode 901. In an experiment, a distance between one end of the inhibitor 101 and one end of the charged electrode 901 is set as L, and a charge neutralization current flowing when the distance L is changed is measured. The charge neutralization current is a current flowing to the charged electrode 901 when the charged electrode 901 is in contact with plasma. In the experiment, an attenuation rate at which plasma emitted from the neutralizer 900 is attenuated by the inhibitor 101 is calculated according to a magnitude of the measured charge neutralization current.

Figure 10:
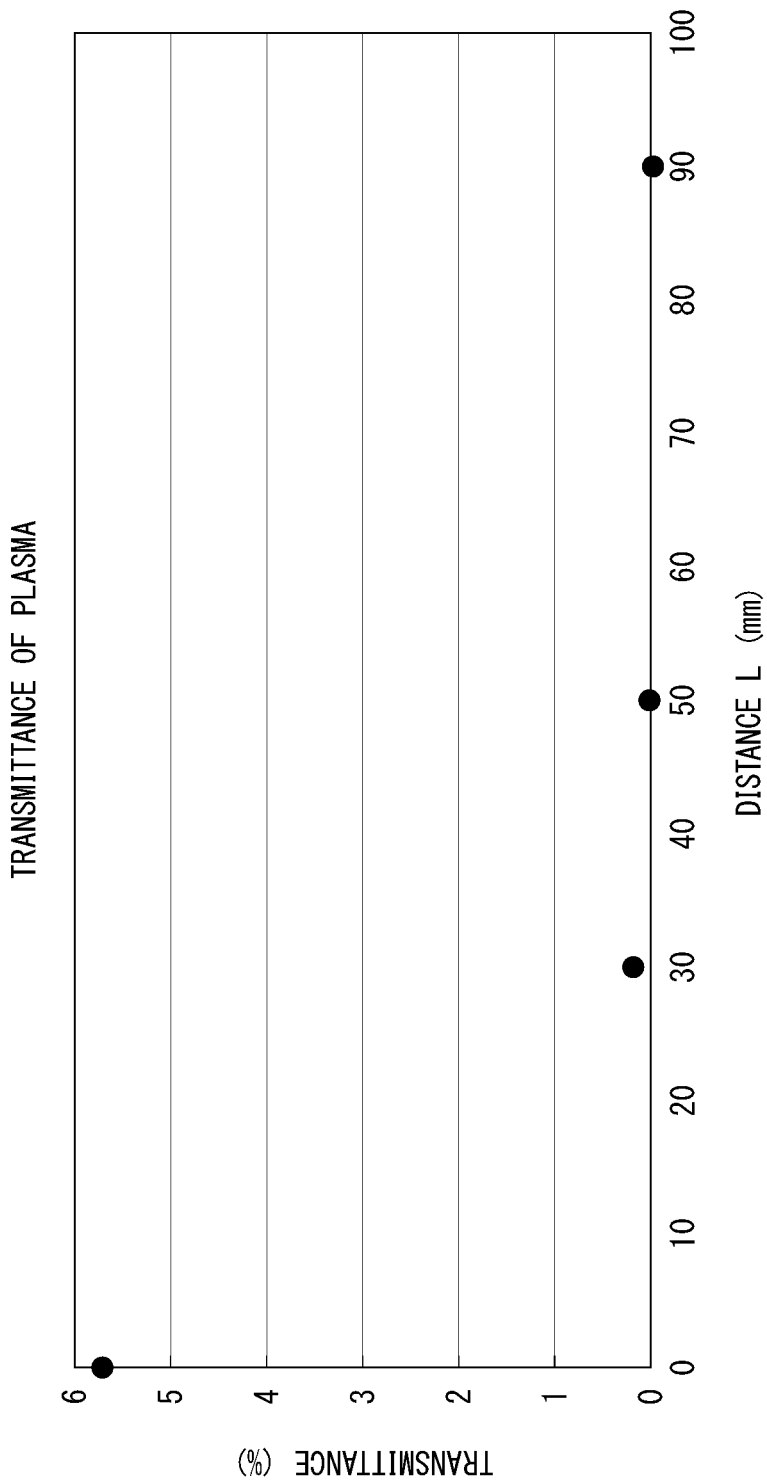
FIG. 10 is a view which shows an example of experimental results indicating the effect of the inhibitor 101 in the modified example.

FIG. 10 is a view which shows an example of experimental results indicating the effect of the inhibitor 101 in the modified example.

A vertical axis of FIG. 10 represents transmittance of plasma. The transmittance is a ratio of a charge neutralization current flowing to the charged electrode 901 when there is the inhibitor 101 with respect to a charge neutralization current flowing to the charged electrode 901 when there is no inhibitor 101. The horizontal axis of FIG. 10 represents the distance L. FIG. 10 shows that the transmittance of plasma decreases as the distance L increases.

Note that the plasma generator 500 may include a heat conductor 503a having a thermal conductivity higher than that of the connector 502 between the plasma source 501 and the connector 502. The heat conductor 503a may be any unit as long as it has a thermal conductivity higher than that of the connector 502.

The heat conductor 503a may be, for example, a mesh of copper or may be a carbon sheet.

Note that the vacuum chamber 1 is an example of a connection destination.

As described above, the embodiments of the present invention have been described in detail with reference to the drawings. However, the specific configuration is not limited to these embodiments, and a design and the like within a scope not departing from the gist of this invention can be included.

INDUSTRIAL APPLICABILITY

According to the charge neutralizer and the plasma generator described above, a charge neutralizer which does not have to include a high vacuum region and a low vacuum region can be provided.

REFERENCE SIGNS LIST

1 Vacuum chamber
2 Vacuum pump
3 High vacuum processing unit
4-1 Sending-out unit
4-2 Guide unit
4-3 Guide unit
4-4 Guide unit
4-5 Guide unit
4-6 Winding unit
4-7 Conveyor
5 Charge neutralization processing unit
100 Charge neutralizer
500 Plasma generator
501 Plasma source
502 Connector
503 Heat conductor
503a Heat conductor
504 Flange
505 Gas port
506 Microwave feedthrough
507 Electron collector
508 Microwave tuner
509 Filament
510 Gas source
511 Flowmeter
512 RF oscillator 512
513 Wattmeter
10 Cylindrical magnet
20 Cylindrical body
30 First magnetic circuit unit
40 Second magnetic circuit unit
50 Antenna
60 Nozzle portion
70 Insulator
101 Inhibitor

The invention claimed is:

1. A charge neutralizer comprising:
a vacuum chamber comprising a high vacuum processing unit, a charged object being capable of being installed in the vacuum chamber; and
a plasma generator configured to supply plasma caused by an electron cyclotron resonance to an inside of the vacuum chamber,
wherein the plasma generator comprises:
a plasma source configured to generate the plasma and installed inside the vacuum chamber; and
a flange mounted on the housing of the vacuum chamber, and
wherein the plasma generator further comprises:
a connector which is positioned between the plasma source and the flange, connects the plasma source with the flange, and is configured to transfer heat generated in the plasma source; and
a heat conductor which is positioned at least one of or both of between the flange and the connector and between the plasma source and the connector, and has a thermal conductivity higher than that of the connector.

2. The charge neutralizer according to claim 1, further comprising:
an electron collector which is positioned between the plasma source and the charged object, and is configured to attract the plasma generated by the plasma source.

3. The charge neutralizer according to claim 2, wherein the electron collector has a hollow shape in which a line connecting a center of the plasma source and a center of the charged object passes substantially through the center.

4. The charge neutralizer according to claim 1,
wherein the plasma source includes a space in which the plasma is generated, and a plurality of openings that inject the plasma generated in the space to the outside.

5. The charge neutralizer according to claim 1,
wherein a pressure in the vacuum chamber is $10^{-5}$ Pa or more and 1 Pa or less.

6. The charge neutralizer according to claim 1, further comprising:
an inhibitor which is configured to inhibit a contact between a part of the charged object and the plasma.

7. The charge neutralizer according to claim 1,
wherein the high vacuum processing unit is configured to execute at least one of a metal vapor deposition process, a ceramic vapor deposition process, a microfabrication process of semiconductor materials, a thin film formation process of semiconductor materials, a thin film generation process of organic materials, and an aluminum vapor deposition process used as a cathode.

8. A charge neutralizer comprising:
a vacuum chamber comprising a high vacuum processing unit, a charged object being capable of being installed in the vacuum chamber; and
a plasma generator configured to supply plasma caused by an electron cyclotron resonance to an inside of the vacuum chamber,
wherein the plasma generator comprises a plasma source configured to generate the plasma and installed inside the vacuum chamber, and
wherein the plasma source includes a space in which the plasma is generated, and a plurality of openings that inject the plasma generated in the space to the outside.

* * * * *